United States Patent
Shin

(10) Patent No.: US 7,538,698 B2
(45) Date of Patent: May 26, 2009

(54) APPARATUS AND METHOD OF GENERATING DBI SIGNAL IN SEMICONDUCTOR INTEGRATED CIRCUIT

(75) Inventor: Beom-Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/826,765

(22) Filed: Jul. 18, 2007

(65) Prior Publication Data

US 2008/0137445 A1    Jun. 12, 2008

(30) Foreign Application Priority Data

Dec. 7, 2006    (KR) .................. 10-2006-0123575

(51) Int. Cl.
*H03M 5/00*    (2006.01)
(52) U.S. Cl. ..................... 341/55; 710/104
(58) Field of Classification Search ............ 341/55, 341/58; 710/104; 712/14; 382/232
See application file for complete search history.

(56) References Cited

U.S. PATENT DOCUMENTS

| 7,139,852 B2 | 11/2006 | LaBerge |
| 2002/0121918 A1 | 9/2002 | Alani et al. |
| 2004/0068594 A1* | 4/2004 | Asaro et al. .................. 710/104 |
| 2005/0216630 A1 | 9/2005 | Gaskins et al. |
| 2007/0115733 A1 | 5/2007 | Jang et al. |

FOREIGN PATENT DOCUMENTS

KR    100621353    8/2006

* cited by examiner

*Primary Examiner*—Rexford Barnie
*Assistant Examiner*—Joseph Lauture
(74) *Attorney, Agent, or Firm*—Venable LLP; Jeffri A. Kaminski

(57) ABSTRACT

An apparatus for generating a DBI signal in a semiconductor integrated circuit includes a full adder that includes data input terminals and a carry terminal, each of which receives data, performs an operation on the received data, and outputs a sum and a carry. A DBI determining unit determines a logic value of each of the data on the basis of the sum and the carry that are transmitted from the full adder, and generates a DBI signal.

14 Claims, 3 Drawing Sheets

APPARATUS AND METHOD OF GENERATING DBI SIGNAL IN SEMICONDUCTOR INTEGRATED CIRCUIT

CROSS-REFERENCE TO RELATED PATENT APPLICATION

This application claims the benefit of Korean Patent Application No. 10-2006-0123575, filed on Dec. 7, 2006, in the Korean Intellectual Property Office, the disclosure of which is incorporated herein in its entirety by reference.

BACKGROUND OF THE INVENTION

1. Technical Field

Embodiment of the present invention relates to an apparatus and method of generating a data bus inversion (DBI) signal in a semiconductor integrated circuit, and more particularly, to an apparatus and method of generating a DBI signal in a semiconductor integrated circuit that increases an area margin.

2. Related Art

In general, semiconductor integrated circuits, such as semiconductor memory apparatuses, output data in multiples of 2 (for example, 128 and 256 data). To this end, the semiconductor integrated circuit includes many data output buffers, and drives data transmitted through global lines. Each of the data output buffers includes an MOS transistor. Each of the MOS transistors drives the data according to the level of each of the data and outputs the driven data to the outside of a chip.

The state of each of the MOS transistors constituting the data output buffers is determined according to a logic value of the data. For example, when data at a high level is transmitted to the data output buffer, which is composed of an NMOS transistor, the NMOS transistor is turned on, such that current flows between a drain terminal and a source terminal of the NMOS transistor. As the number of MOS transistors increases, the current that flows among the plurality of MOS transistors included in the plurality of data output buffers increase, the semiconductor integrated circuit has a high current loss, and thus, power efficiency is reduced.

In order to solve the above-described current loss, a data bus inversion (DBI) technique is introduced into the semiconductor integrated circuit according to the related art. According to the DBI technique, it is determined how many data generate current for transistors of data output buffers among a predetermined number of data (for example, 8 data). When it is determined that a lot of data generates current, the data is inverted to thereby reduce the current loss. For example, when NMOS transistors are included in data output buffers, the semiconductor integrated circuit does not invert the data when among the eight data, less than 5 data are at a high level, but transmits the data to the data output buffers. On the other hand, the semiconductor integrated circuit inverts the data when among the eight data, five or more data are at a high level, and transmits the data to the data output buffers.

In order to perform the above-described operation, the semiconductor integrated circuit includes an apparatus for generating a DBI signal. As described above, the apparatus for generating a DBI signal determines the number of data that generate current, and generates a DBI signal. That is, when the DBI signal is enabled, a DBI control unit inverts the data that is transmitted to each of the data output buffers. On the other hand, when the DBI signal is disabled, the DBI control unit does not invert the data that is transmitted to each of the data output buffers. The DBI technique is applied to semiconductor integrated circuits, such as graphic processing units (GPUs), as well as to semiconductor memory apparatuses. The DBI technique can be implemented in general semiconductor integrated circuits that target low power consumption.

FIG. 1 is a block diagram showing the structure of an apparatus for generating a DBI signal in a semiconductor integrated circuit according to the related art. In FIG. 1, the apparatus for generating a DBI signal generates a DBI signal DBI_flag from eight data GIO<1:8> transmitted through global lines.

As shown in FIG. 1, the apparatus for generating a DBI signal includes four 2-input counters 2, two 6-input counters 4, and one 8-input counter 6. Each of the 2-input counters 2 receives two data among the eight data GIO<1:8> that are transmitted through the global input/output lines. Each of the 2-input counters 2 determines how many data are at a high level, that is, how many data have a logic value of '1' between the two data, and enables a first 0-number determination signal dtng1<0>, a first 1-number determination signal dtng1<1>, or a first 2-number determination signal dtng1<2>. Then, using the two first 0-number determination signals dtng1<0>, the two first 1-number determination signals dtng1<1>, and the two first 2-number determination signals dtng1<2> that are transmitted from the two 2-input counters 2 among the four 2-input counters 2, each of the 6-input counters 4 determines how many data have the logic value of '1' among the four data, and determines whether or not to enable a second 0-number determination signal dtng2<0>, a second 2-number determination signal dtng2<2>, a second 3-number determination signal dtng2<3>, and a second 4-number determination signal dtng2<4>. At this time, when among the four data, one data has a logic value of '1', all of the second 0-number determination signal dtng2<0>, the second 2-number determination signal dtng2<2>, the second 3-number determination signal dtng2<3>, and the second 4-number determination signal dtng2<4> are disabled.

Then, using the two second 0-number determination signals dtng2<0>, the two second 2-number determination signals dtng2<2>, the two second 3-number determination signals dtng2<3>, and the two second 4-number determination signals dtng2<4> that are transmitted from the two 6-input counters 4, the 8-input counter 6 determines how many data have the logic value of '1' among the eight data, and determines whether or not to enable the DBI signal DBI_flag. That is, the 8-input counter 6 enables the DBI signal DBI_flag when among the eight data, five or more data have the logic value of '1', and disables the DBI signal DBI_flag when less than five data have the logic value of '1' among the eight data.

As described above, since the apparatus for generating a DBI signal according to the related art includes the seven counters in order to perform an operation process including three steps, the area of the apparatus for generating a DBI signal is not small. Further, since the signal output lines of each of the 2-input counters are 1.5 times as many as the signal input lines, an improvement in integration of the apparatus for generating a DBI signal is limited. That is, the structure of the apparatus for generating a DBI signal according to the related art makes it difficult to increase an area margin.

SUMMARY OF THE INVENTION

Embodiments of the present invention provide an apparatus and method of generating a DBI signal in a semiconductor integrated circuit that may increase an area margin and realize a high degree of integration.

An embodiment of the present invention may provide an apparatus for generating a data bus inversion (DBI) signal in a semiconductor integrated circuit that may include: a full adder that may be configured to include data input terminals and a carry input terminal, each of which may receive data and to performs an operation on the received data, thereby outputting a sum and a carry; and a DBI determining unit that may be configured to determine a logic value of each of the data on the basis of the sum and the carry that are transmitted from the full adder, thereby generating a DBI signal.

Another embodiment of the present invention may provide an apparatus for generating a data bus inversion (DBI) signal in a semiconductor integrated circuit that may include: first and second full adders each of which may include two data input terminals and one carry input terminal, each receiving data and adds the received data, thereby outputting a sum and a carry; a third full adder that may be configured to include two data input terminals, each of which may receive data, and a carry input terminal receiving a level fixing signal and to add the received data and the level fixing signal, thereby outputting a sum and a carry; and a DBI determining unit that may be configured to receive the sums and the carries, which may be transmitted from the first, second, and third full adders, and to generate a DBI signal that is enabled when the number of data having a first logic value exceeds half of the number of data that are input to the first, second, and third full adders.

Still another embodiment of the present invention may provide a method of generating a data bus inversion (DBI) signal in a semiconductor integrated circuit that may include: generating a sum and a carry by inputting data to data input terminals and a carry input terminal of a full adder; and determining a logic value of output data on the basis of the sum and the carry that are generated by the full adder, thereby generating a DBI signal.

Yet another embodiment of the present invention may provide a method of generating a DBI signal in a semiconductor integrated circuit that may include: generating sums and carries by inputting data to two data input terminals and one carry input terminal of each of the first and second full adders, and generating a sum and a carry by inputting data to two data input terminals of a third full adder and a level fixing signal to a carry input terminal thereof; and receiving the sums and the carries that are generated by the first, second, and third full adders, and generating a DBI signal that is enabled when the number of data having a first logic value exceeds half of the number of data that are input to the first, second, and third full adders.

DESCRIPTION OF EXEMPLARY EMBODIMENT

An exemplary embodiment of the present invention will now be described in detail with reference to the accompanying drawings.

Figure 1:
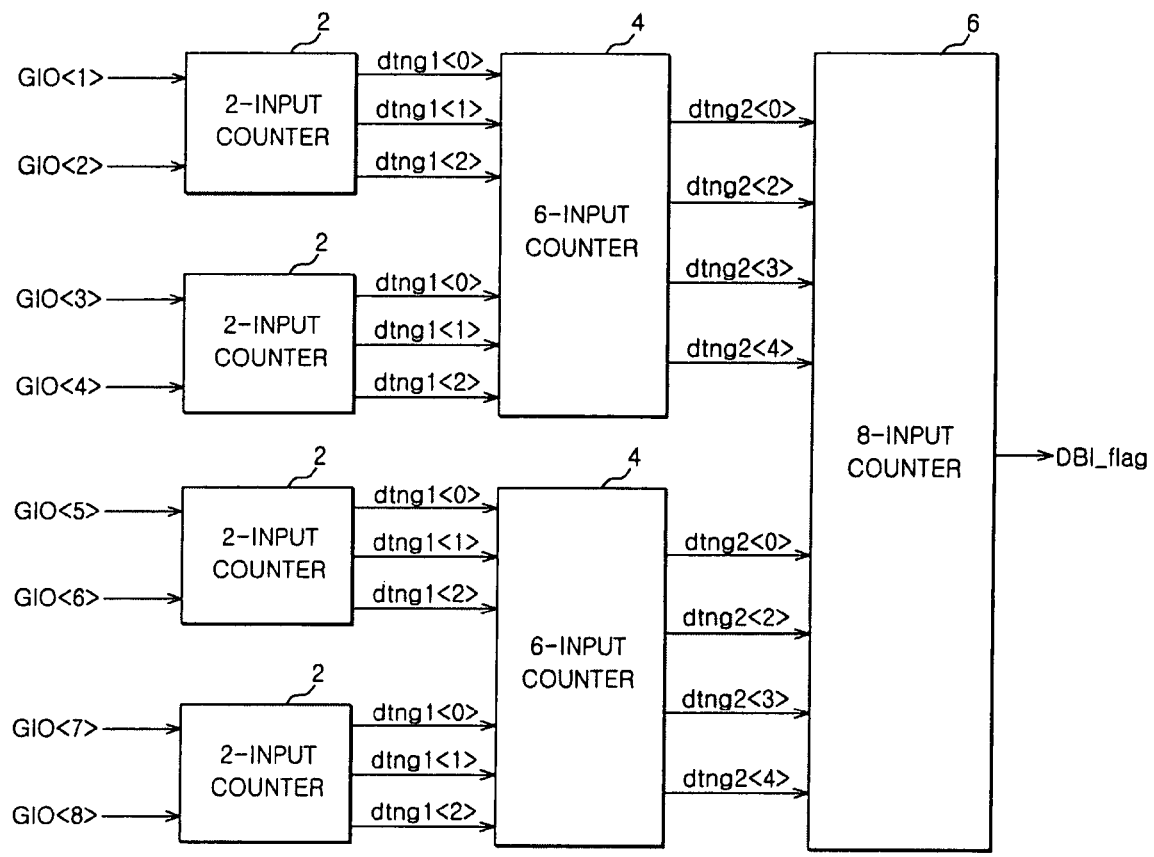
FIG. 1 is a block diagram showing the structure of an apparatus for generating a DBI signal in a semiconductor integrated circuit according to the related art.
Figure 2:
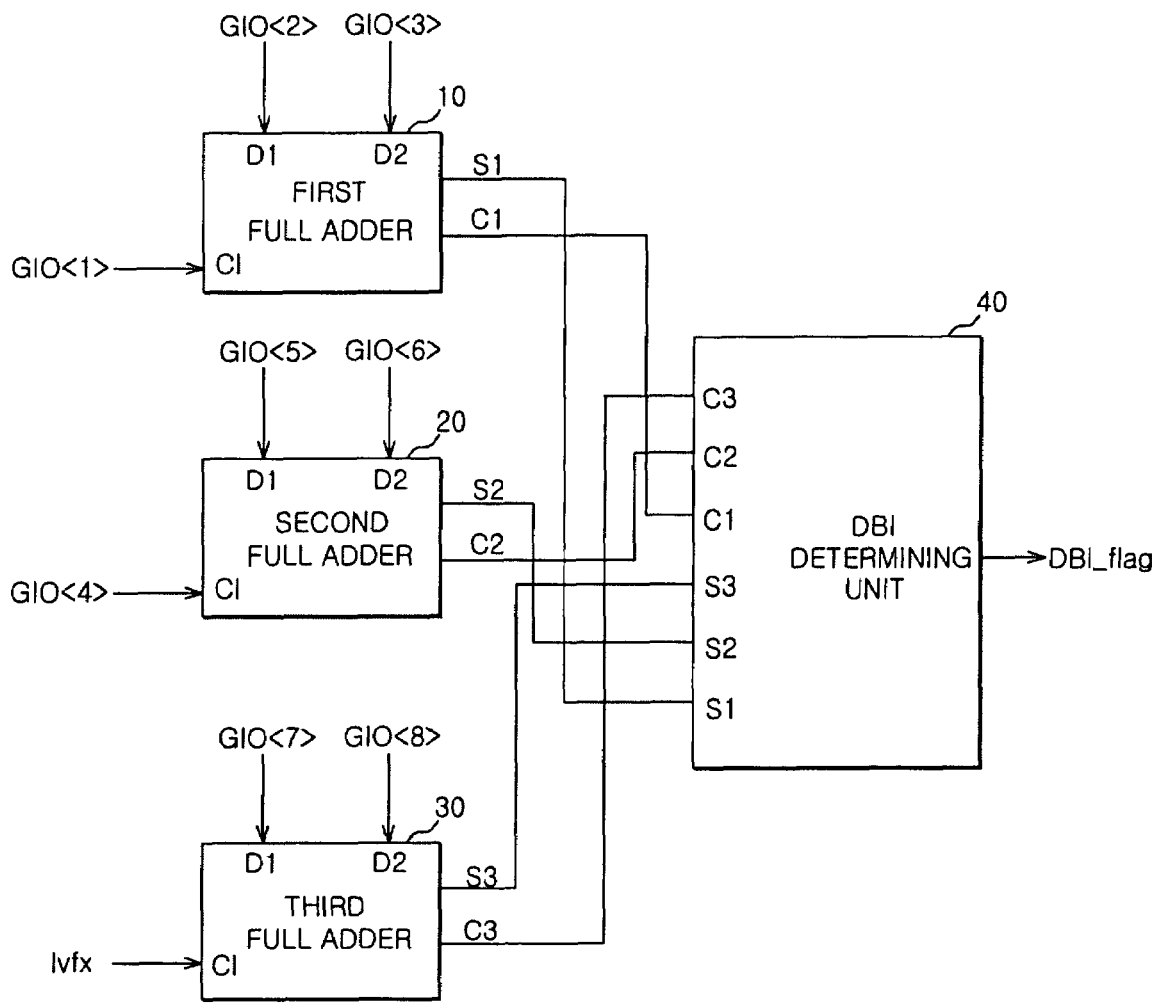
FIG. 2 is a block diagram showing the structure of an apparatus for generating a DBI signal in a semiconductor integrated circuit according to an embodiment of the present invention.

FIG. 2 is a block diagram showing an example of the structure of an apparatus for generating a DBI signal in a semiconductor integrated circuit according to an embodiment of the present invention. In FIG. 2, the apparatus for generating a DBI signal may generate a DBI signal DBI_flag from eight data GIO<1:8> that are transmitted through global lines.

As shown in FIG. 2, the exemplary apparatus for generating a DBI signal may include a first full adder 10, a second full adder 20, a third full adder 30, and a DBI determining unit 40.

The first full adder 10 may include a carry input terminal CI receiving data 1 (GIO<1>), a first data input terminal D1 receiving data 2 (GIO<2>), and a second data input terminal D2 receiving data 3 (GIO<3>). The first full adder 10 may add the received data to each other, and output a sum 1 (S1) and a carry 1 (C1).

The second full adder 20 may include a carry input terminal CI receiving data 4 (GIO<4>), a first data input terminal D1 receiving data 5 (GIO<5>), and a second data input terminal D2 receiving data 6 (GIO<6>). The second full adder 20 may add the received data to each other, and output a sum 2 (S2) and a carry 2 (C2).

The third full adder 30 may include a carry input terminal C1 receiving a level fixing signal lvfx, a first data input terminal D1 receiving data 7 (GIO<7>), and a second data input terminal D2 receiving data 8 (GIO<8>). The third full adder 30 may add the received data and the level fixing signal, and outputs a sum 3 (S3) and a carry 3 (C3).

That is, each of the first, second, and third full adders 10, 20, and 30 may add the three data to each other. The level fixing signal lvfx may have a logic value of '1' at all times while a circuit for generating the DBI signal is being operated. The level fixing signal lvfx may be achieved by using an arbitrary signal indicating the generation of the DBI signal, a mode register set signal, or a fuse signal. The level fixing signal lvfx may be achieved by using other signals other than the above-described signals.

The DBI determining unit 40 may receive the sum 1 (S1), the sum 2 (S2), the sum 3 (S3), the carry 1 (C1), the carry 2 (C2), and the carry 3 (C3), determine how many data have a logic value of '1' among the data 1 to 8 (GIO<1:8>) and the level fixing signal lvfx, thereby generating a DBI signal DBI_flag. The DBI determining unit 40 may enable the DBI signal DBI_flag when a predetermined number, for example, six or more data among the data 1 to 8 (GIO<1:8>) and the level fixing signal lvfx have a logic value of '1'. The DBI determining unit 40 may disable the DBI signal DBI_flag when less than a predetermined number, for example, six data among the data 1 to 8 (GIO<1:8>) and the level fixing signal lvfx have a logic value of '1'. The level fixing signal lvfx may have the logic value of '1' at all times. Therefore, the determination of the DBI determining unit 40 whether the number of data having the logic value of '1' is equal to or larger than, for example, six or smaller than, for example, six leads to the same result when the DBI determining unit 40 determines whether the number of data having a logic value of '1' is equal to or larger than 5 or smaller than 5 among the eight data (GIO<1:8>)) input to the first, second, and third full adders 10, 20, and 30.

In an exemplary embodiment, the DBI determining unit 40 may determine how many data have a logic value of '1' among the eight data (GIO<1:8>) according to the following logic.

When each of the carry 1 (C1), the carry 2 (C2), and the carry 3 (C3) has a logic value of '1', at least six data among the eight data (GIO<1:8>) have logic values of '1'. Therefore, the DBI signal DBI_flag is enabled.

This may be represented by the following equation:

$$DBI\ signal\ DBI\_flag = C1*C2*C3$$

If any two of the carry 1 (C1), the carry 2 (C2), and the carry 3 (C3) have logic values of '1', when at least two of the sum 1 (S1), the sum 2 (S2), and the sum 3 (S3) have a logic value of '1', the DBI signal DBI_flag is enabled.

This may be represented by the following equation:

$$DBI\ signal\ DBI\_flag = (C1*C2+C2*C3+C1*C3)*(S1*S2+S2*S3+S1*S3)$$

When one of the carry 1 (C1), the carry 2 (C2), and the carry 3 (C3) has a logic value of '1', even though all of the sum 1 (S1), the sum 2 (S2), and the sum 3 (S3) have logic values of '1', the DBI signal DBI_flag is disabled.

A case in which the DBI signal DBI_flag is enabled according to the above-described logic may be represented by the following equation:

$$DBI\ signal\ DBI\_flag = C1*C2*C3 + (C1*C2+C2*C3+C1*C3)*(S1*S2+S2*S3+S1*S3).$$

The DBI determining unit 40 may be configured according to the equation that generates the DBI signal DBI_flag. The structure of the exemplary DBI determining unit 40 is shown in FIG. 3.

Figure 3:
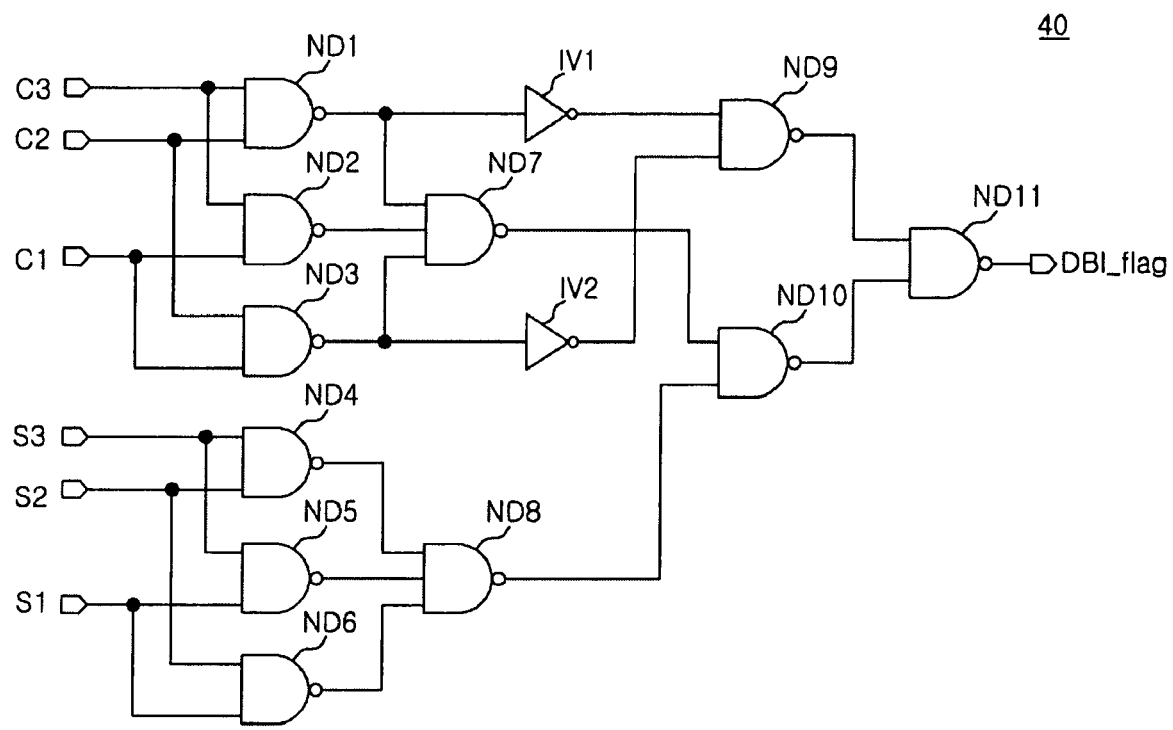
FIG. 3 is a circuit diagram showing an example of the detailed structure of a DBI determining unit shown in FIG. 2.

Referring FIG. 3, the DBI determining unit 40 may include first to eleventh NAND gates ND1 to ND11 and first and second inverters IV1 and IV2.

The first NAND gate ND1 receives the carry 2 (C2) and the carry 3 (C3).

The second NAND gate ND2 receives the carry 1 (C1) and the carry 3 (C3).

The third NAND gate ND3 receives the carry 1 (C1) and the carry 2 (C2).

The fourth NAND gate ND4 receives the sum 2 (S2) and the sum 3 (S3).

The fifth NAND gate ND5 receives the sum 1 (S1) and the sum 3 (S3).

The sixth NAND gate ND6 receives the sum 1 (S1) and the sum 2 (S2).

The first inverter IV1 receives an output signal of the first NAND gate ND1.

The seventh NAND gate. ND7 receives output signals of the first, second, and third NAND gates ND1, ND2, and ND3.

The second inverter IV2 receives an output signal of the third NAND gate ND3.

The eighth NAND gate ND8 receives output signals of the fourth, fifth, and sixth NAND gates ND4, ND5, and ND6.

The ninth NAND gate ND9 receives output signals of the first and second inverters IV1 and IV2.

The tenth NAND gate ND10 receives output signals of the seventh and eighth NAND gates ND7 and ND8.

The eleventh NAND gate ND11 receives output signals of the ninth and tenth NAND gates ND9 and ND10.

In the DBI determining unit 40 having the above-described structure, when each of the carry 1 (C1), the carry 2 (C2), and the carry 3 (C3) has the logic value of '1', each of the output signals of the first and third NAND gates ND1 and ND3 becomes a low level, and each of the output signals of the first and second inverters IV1 and IV2 becomes a high level. Therefore, the output signal of the ninth NAND gate ND9 becomes a low level. Accordingly, the eleventh NAND gate ND11 outputs the DBI signal DBI flag at a high level, that is, the enabled DBI signal DBI flag, in response to the input of the signal at the low level.

When two of the carry 1 (C1), the carry 2 (C2) and the carry 3 (C3) have a logic value of '1', the output signals of the first NAND gate ND1 and the third NAND gate ND3 have different logic values. Therefore, the ninth NAND gate ND9 outputs a signal at a high level. The output signal of the seventh NAND gate ND7 becomes a high level.

In this case, any one of the fourth, fifth, and sixth NAND gates ND4, ND5, and ND6 outputs a signal at a low level. Therefore, the eighth NAND gate ND8 outputs a signal at a high level, and thus, the tenth NAND gate ND10 outputs a signal at a low level. Accordingly, the eleventh NAND gate ND 11 outputs the DBI signal DBI_flag at the high level.

In cases other than those described above, it can be easily understood from the described circuit configuration that each of the ninth and tenth NAND gates ND9 and ND10 becomes a high level, and thus, the eleventh NAND gate ND11 outputs the DBI signal DBI_flag at a low level.

That is, the DBI determining unit 40, which is configured according to the above-described equations, determines whether among the eight data (GIO<1:8>) and the level fixing signal lvfx, six or more data have a logic value of '1' on the basis of the sum 1 (S1), the sum 2 (S2), the sum 3 (S3), the carry 1 (C1), the carry 2 (C2), and the carry 3 (C3), and determines whether or not to enable the DBI signal DBI_flag.

As such, the occupied area of the apparatus for generating a DBI signal, which may include the three full adders 10, 20, and 30, and the above-described DBI determining unit 40 according to an embodiment of the present invention, may be remarkably reduced as compared with the apparatus for generating a DBI signal according to the related art. As a result of comparing the area of the apparatus for generating a DBI signal according to an embodiment of the present invention with the area of the apparatus for generating a DBI signal according to the related art on the basis of the number of internal elements provided in the apparatuses, it can be seen that the area of apparatus for generating a DBI signal according to an embodiment of the present invention may be approximately 49% of the area of the apparatus for generating a DBI signal according to the related art. In addition, as compared with the related art, since the number of lines through which signals are transmitted is reduced, it is easier to improve the degree of integration of the apparatus for generating a DBI signal according to an embodiment of the present invention. Since a large number of apparatuses for generating a DBI signal are provided in the semiconductor integrated circuit, embodiments of the present invention may significantly increase the area margin of the semiconductor integrated circuit.

Further, in view of the power consumed by each of the elements, it can be seen that power consumption of the apparatus for generating a DBI signal according to an embodiment of the present invention that includes a small number of elements is greatly reduced compared to the related art. That is, embodiments of the present invention may also have an advantage of improving the power efficiency of the semiconductor integrated circuit.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, the apparatus and method of generating a DBI signal in the semiconductor integrated circuit according to an embodiment of the present invention may reduce the number of elements and lines provided therein to thereby increase the area margin and achieve a high degree of integration.

Further, the apparatus and method of generating a DBI signal in the semiconductor integrated circuit according to an embodiment of the present invention may be driven by using a relatively small number of elements to thereby reduce power consumption and improve power efficiency.

What is claimed is:

1. An apparatus for generating a data bus inversion (DBI) signal in a semiconductor integrated circuit comprising:
    a plurality of full adders including data input terminals and a carry input terminal, wherein each of the data input terminals and the carry input terminal receives data, and each of the full adders is configured to perform an operation on the received data, thereby outputting a sum and a carry; and
    a DBI determining unit configured to determine a logic value of each of the data on the basis of the sum and the carry from the full adder, thereby generating a DBI signal,
    wherein one of the plurality of full adders is configured to receive data through the data input terminals and receive a level fixing signal through the carry input terminal.

2. The apparatus of claim 1,
    wherein the DBI determining unit is configured to enable the DBI signal when a number of data having a first logic value among the plurality of data that are input to the full adder is equal to or larger than a predetermined number, and to disable the DBI signal when the number of data having the first logic value is smaller than the predetermined number.

3. The apparatus of claim 1,
    wherein the level fixing signal has a first logic value at all times while the DBI signal is generated.

4. An apparatus for generating a data bus inversion (DBI) signal in a semiconductor integrated circuit comprising:
    first and second full adders, each of which includes two data input terminals and one carry input terminal, each receiving data as input and adding the received data, thereby outputting a sum and a carry;
    a third full adder including two data input terminals, each of which receives data, and a carry input terminal receiving a level fixing signal, and configured to add the received data and the level fixing signal, thereby outputting a sum and a carry; and
    a DBI determining unit configured to receive the sums and the carries from the first, second, and third full adders, and to generate a DBI signal that is enabled when a number of data having a first logic value exceeds half of a number of data that are input to the first, second, and third full adders.

5. The apparatus of claim 4,
    wherein the level fixing signal has a first logic value at all times while the DBI signal is generated.

6. The apparatus of claim 4,
    wherein the DBI determining unit is configured to enable the DBI signal when each of the carries transmitted from the first, second, and the third full adders has the first logic value.

7. The apparatus of claim 4,
    wherein the DBI determining unit is configured to enable the DBI signal when two of the carries transmitted from the first, second, and third full adders have the first logic value, and at least two of the sums transmitted from the first, second, and third full adders have the first logic value.

8. A method of generating a data bus inversion (DBI) signal in a semiconductor integrated circuit comprising:
    generating sums and carries by inputting data to data input terminals and a carry input terminal of each of a plurality of the full adders; and
    determining a logic value of output data on the basis of the sums and the carries generated by the plurality of the full adders, thereby generating a DBI signal,
    wherein the generating the sums and the carries includes generating a sum and a carry by inputting data to data input terminals and by inputting a level fixing signal to a carry input terminal of one of the plurality of full adders.

9. The method of claim 8,
    wherein the generating of the DBI signal comprises enabling the DBI signal when a number of data having a first logic value is equal to or larger than a predetermined number among a plurality of data that are input to the full adder, and disabling the DBI signal when the number of data having the first logic value is smaller than the predetermined number.

10. The method of claim 8,
    wherein the level fixing signal has a first logic value at all times while the DBI signal is generated.

11. A method of generating a DBI signal in a semiconductor integrated circuit comprising;
    generating sums and carries by inputting data to two data input terminals and one carry input terminal of each of first and second full adders, and generating a sum and a carry by inputting data to two data input terminals of a third full adder and a level fixing signal to a carry input terminal thereof; and
    receiving the sums and the carries that are generated by the first, second, and third full adders, and generating a DBI signal that is enabled when a number of data having a first logic value exceeds half of a number of data that are input to the first, second, and third full adders.

12. The method of claim 11,
    wherein the level fixing signal has the first logic value at all times while the DBI signal is generated.

13. The method of claim 11,
    wherein the generating of the DBI signal is configured to enable the DBI signal when each of the carries that are output from the first, second, and third full adders has the first logic value.

14. The method of claim 11,
    wherein the generating of the DBI signal is configured to enable the DBI signal when two of the carries output from the first, second, and third full adders have the first logic value, and at least two of the sums output from the first, second, and third full adders have the first logic value.

* * * * *